US00RE41295E

(19) United States
(12) Reissued Patent
Cauchy

(10) Patent Number: US RE41,295 E
(45) Date of Reissued Patent: May 4, 2010

(54) MOTOR VEHICLE TEMPERATURE CONTROLLED COMPARTMENT

(75) Inventor: Charles J. Cauchy, Traverse City, MI (US)

(73) Assignee: Tellurex Corporation, Traverse City, MI (US)

(21) Appl. No.: 11/059,703

(22) Filed: Feb. 16, 2005

Related U.S. Patent Documents

Reissue of:
(64) Patent No.: 6,282,906
Issued: Sep. 4, 2001
Appl. No.: 09/523,208
Filed: Mar. 10, 2000

(51) Int. Cl.
*F25B 21/02* (2006.01)

(52) U.S. Cl. ..... 62/3.3; 62/3.6; 62/3.61; 62/244

(58) Field of Classification Search ..... 62/3.3, 62/3.6, 3.61, 244
See application file for complete search history.

(56) References Cited

U.S. PATENT DOCUMENTS 4,301,658 A 11/1981 Reed
4,384,512 A * 5/1983 Keith ..... 99/308
4,823,554 A * 4/1989 Trachtenberg et al. ..... 62/3.3
5,099,649 A * 3/1992 Zorn ..... 62/3.61
5,701,754 A * 12/1997 Choi et al. ..... 62/244
5,927,091 A * 7/1999 Hong ..... 62/244
5,941,077 A * 8/1999 Safyan ..... 62/3.3
6,026,646 A * 2/2000 Hansen et al. ..... 62/3.6
6,092,381 A * 7/2000 Hsiao et al. ..... 62/237
6,412,287 B1 * 7/2002 Hughes et al. ..... 62/3.61
6,449,958 B1 * 9/2002 Foye ..... 62/3.2
6,640,551 B1 * 11/2003 Slone et al. ..... 62/3.61
6,732,534 B2 * 5/2004 Spry ..... 62/3.7
6,918,257 B2 * 7/2005 Slone et al. ..... 62/3.61
2004/0068992 A1 * 4/2004 Cauchy ..... 62/3.61

* cited by examiner

*Primary Examiner*—Marc E Norman
(74) *Attorney, Agent, or Firm*—Flynn, Thiel, Boutell & Tanis, P.C.

(57) ABSTRACT

A temperature controlled mobile vehicle compartment for providing a convenient article storage having a heat exchanger thermally connected to a thermoelectric device controlling thermal energy flow to and from the compartment. An air duct assembly cooperates with the thermoelectric device to vent the heat from the device outside the compartment and segregates the inflow air from the outflow air which received the thermal energy.

11 Claims, 7 Drawing Sheets

MOTOR VEHICLE TEMPERATURE CONTROLLED COMPARTMENT

Matter enclosed in heavy brackets [ ] appears in the original patent but forms no part of this reissue specification; matter printed in italics indicates the additions made by reissue.

*This application is a reissue application of U.S. Ser. No. 09/523,208, filed Mar. 10, 2000, now U.S. Pat. No. 6,282, 906, issued on Sep. 4, 2001.*

FIELD OF THE INVENTION

The present invention generally relates to a mobile vehicle temperature controlled compartment, and more particularly to a temperature controlled compartment provided in a mobile vehicle console.

BACKGROUND OF THE INVENTION

Consoles are conventionally provided in vehicles to provide an enclosed storage space accessible to the vehicle occupants. In such a storage space, vehicle occupants store miscellaneous articles including music tapes, compact disks, coins, address books, etc. The articles conventionally stored in these storage spaces do not require a specific temperature and thus the console temperature generally corresponds to the ambient air temperature in the vehicle. However, some articles, for example beverages, food, insulin, etc., require a temperature controlled environment which would provide a driver and/or passenger convenient and safe storage for these articles. Operators of vehicles continually demand greater conveniences in their mobile vehicles and, therefore, it is an object of this invention to provide a temperature controlled compartment wherein articles in need of a cooled or heated environment may be stored. By placing the temperature controlled compartment in the console, which is readily available to the vehicle driver, the distraction of the driver from the road and happenings around the vehicle is reduced.

Thermoelectric devices are known which utilize the Peltier effect in solid state electrical components to operate as small heat pumps. Thermoelectric devices include a plurality of thermocouples mounted between heat sinks. The thermocouples transfer thermal energy from one heat sink to the other dependent on the direction of DC power applied to the thermocouples.

The present invention addresses the above need for convenient mobile vehicle temperature controlled compartments by utilizing thermoelectric devices to control the temperature in the vehicle compartments.

SUMMARY OF THE INVENTION

A vehicle console encloses at least one compartment, the temperature of which can be controlled by a thermoelectric device, heat exchanger, and air duct assembly. The heat exchanger is mounted in thermal communication with the compartment. The thermoelectric device controls the flow of thermal energy to or from the heat exchanger and transfers the thermal energy to the air duct assembly. The air duct assembly transfers the thermal energy to air flowing therethrough.

Another feature of the invention is that the air duct assembly segregates the incoming air from the outgoing air to improve system performance by keeping the temperature difference between the incoming and outgoing air at a maximum.

The invention also provides a forced air convection device in the temperature controlled compartment. The forced air convection device is mounted in the console and draws air therefrom and forces the same through a heat exchanger which includes a heat exchanger plate and radiator fins that are in thermoconductive contact with the heat exchanger plate so as to temperature condition the air flowing through the convection device. The forced air convection device vents the air into the temperature controlled compartment after temperature conditioning the air.

Figure 1:
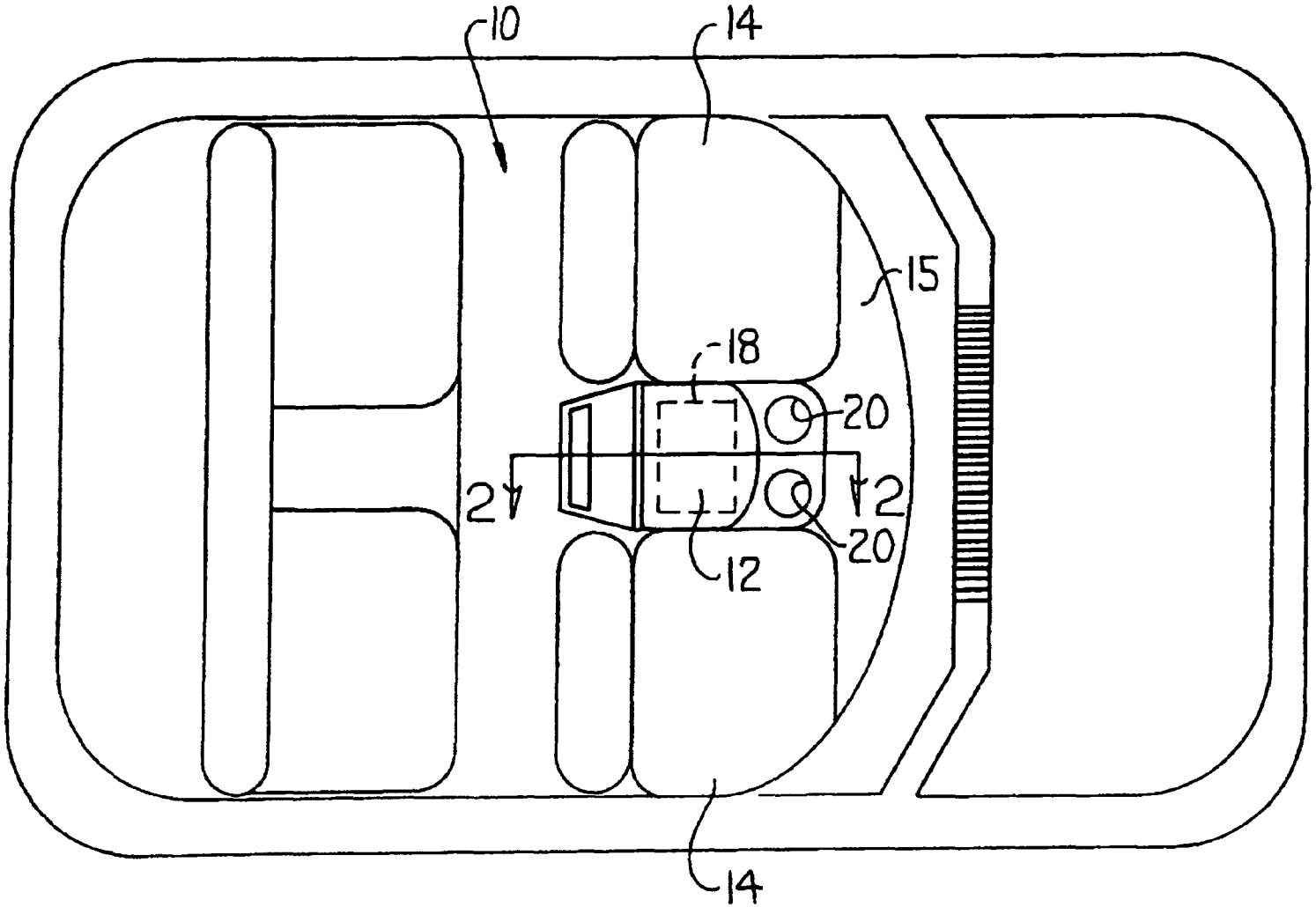
FIG. 1 is a top view of a vehicle passenger compartment including a console.

Certain terminology will be used in the following description for convenience in description only and will not be limiting unless expressly claimed. The words "up", "down", "top", "bottom", "right", and "left" will designate directions in the drawings to which reference is made. The words "in" and "out" will refer to directions toward and away from the geometric center of the device and designated parts thereof. Such terminology will include derivatives and words of similar meaning.

DETAILED DESCRIPTION

Figure 2:
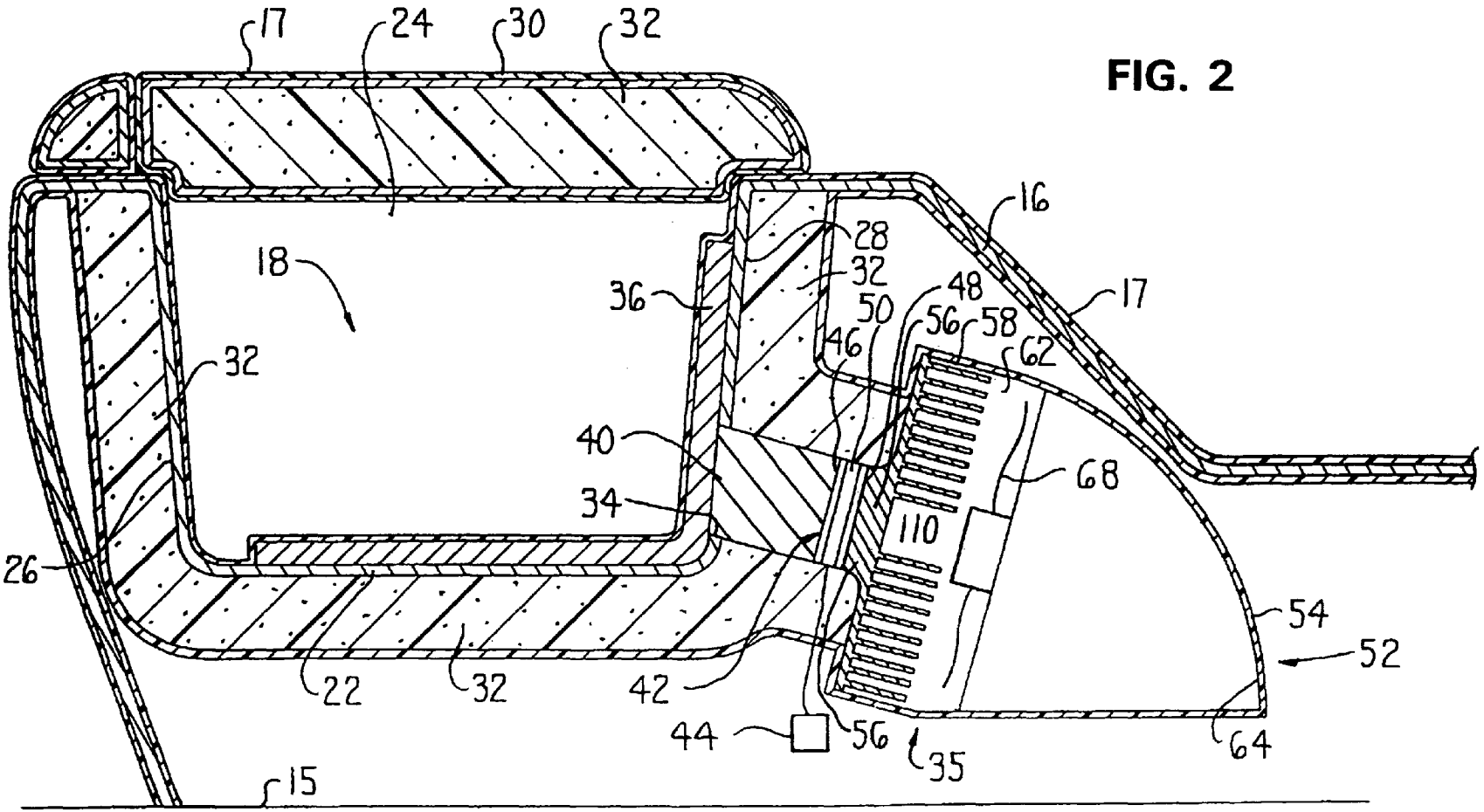
FIG. 2 is a cross sectional view of the console of FIG. 1.

Referring to FIGS. 1 and 2, there is shown a motor vehicle passenger compartment 10 including a console 12 positioned between the seats 14. The console 12 is usually plastic, rigid body or housing 16 which is secured to the vehicle compartment floor 15 and covered by a decorative protective covering 17. The console 12 has at least one enclosed storage compartment 18 and cup holders 20 which are positioned forwardly of the storage compartment and recessed into the console body 16. The compartment 18 has a generally horizontally extending bottom wall 22, upwardly extending side 24, front 28 and rear 26 walls and a cover 30 pivotally connected to the rear wall 26 (FIG. 2). The walls 22, 24, 26 and 28 and cover 30 are laminated with insulation 32 to thermally insulate the compartment 18 from the surrounding environment. The front wall 28 has an opening 34 extending therethrough.

The console 12 is provided with a system 35 for controlling the temperature in the console storage compartment 18. An L-shaped thermally conductive heat exchanger 36 is in contact with at least part of the front wall 28 and the bottom wall 22 and extends over the front wall opening 34. It will be understood that the heat exchanger 36 can be constructed to any shape so long as it is thermally connected with the compartment and can be in contact with any number of walls, e.g., all of the upright walls of the compartment. In the described embodiment, the heat exchanger 36 is constructed from aluminum to have an efficient heat conduction and light weight.

A thermally conductive element 40 extends through the front wall opening 34 and is in thermal communication with the heat exchanger 36 adjacent the corner thereof. The thermally conductive element 40 can be constructed from solid aluminum or any other thermally conductive material so long as it has adequate thermal conductive properties. At an end of the thermally conductive element 40 remote from the heat exchanger 36 is a thermoelectric system 42 which is connected to an electrical power supply 44 mounted in the vehicle, for example a 12 volt electrical system of an automobile. Insulation 32 is provided around the thermoelectric system 42 to thermally isolate the system. Plates 46, 48 attached to a thermoelectric device 50 made up of thermoelectric elements act as heat sinks, one of which is a hot sink and the other is a cold sink depending on the direction of direct current flowing from the electrical power source 44 to the thermoelectric device 50. A thermoelectric device plate 46 contacts an end of the thermally conductive element 40.

Figure 3:
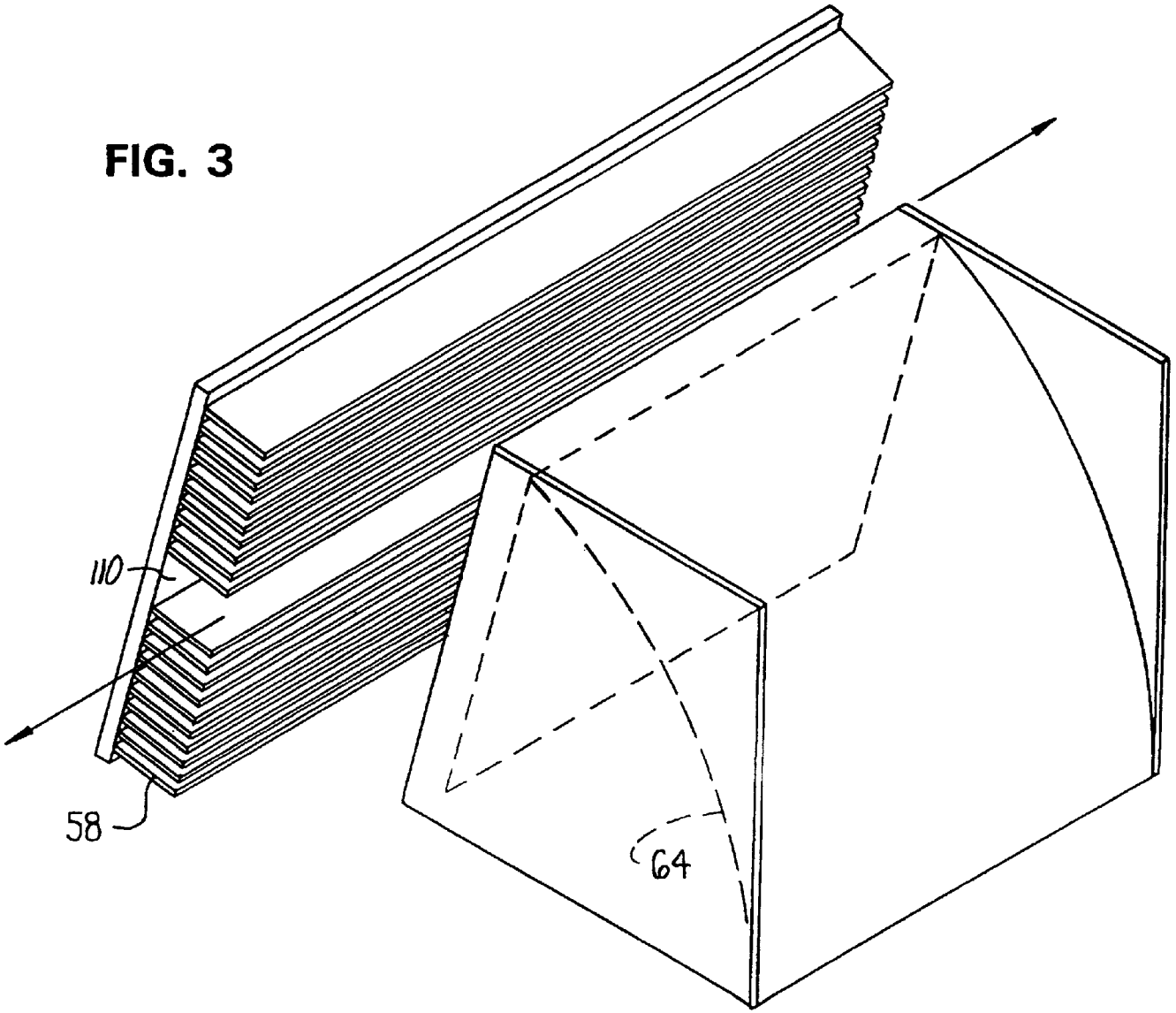
FIG. 3 is an isometric view of the FIG. 2 heat sink.

An air duct assembly 52 is mounted within the console 12 and is in thermal communication with the thermoelectric system 42. The air duct assembly 52 has a housing 54 and a solid extension member 56 extending from the housing and contacting thermoelectric device plate 48. The solid extension member 56 is made of a thermally conductive material, for example aluminum, to provide adequate thermoconductivity. Within the housing 54 are radiator fins 58 which extend from the solid extension member 56. The air duct assembly 52 comprises an inflow air duct 64 and an outflow air duct 110 which are fluidly connected to provide air flow through the assembly. The outflow air duct 110 passes air by the radiator fins 58 and a side of the extension 56 so that heat is transferred to the inflowing air and is vented with the outflowing air. To positively provide air flow through the air duct assembly 52, a fan 68 is provided to draw inflow air through the inflow air duct 64, pass the air around the radiator fins 58 and exhaust the air into outflow air duct 110. *As shown in FIGS. 2–4, the fan 68, 68A can be provided in the air inflow duct 64, the inflow air exits the air inflow duct 64 opposite to the extension member 56, 56A so that the air inflow is perpendicular to the extension member 56, 56A and the air outflow is parallel to the extension member 56, 56A.*

Figure 4:
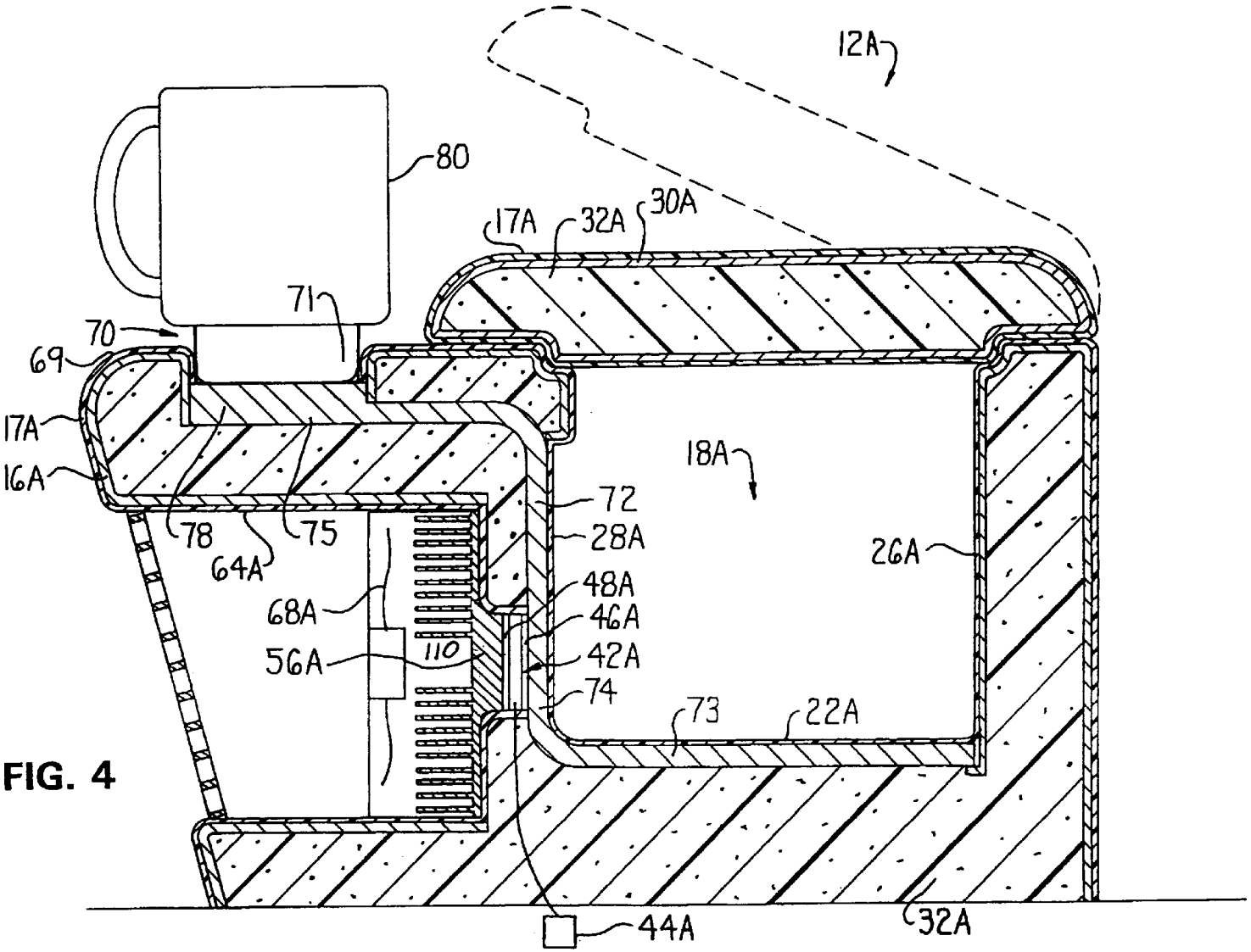
FIG. 4 is a cross sectional view of an alternate embodiment of the vehicle console.

Referring to FIG. 4, there is shown a modification of the above described console. The modified console 12A has a forwardly extending, insulated beverage container support member 69 provided at an upper forward position of the console 12A. A beverage container recess 71 is provided in an upper portion of support member 69. The recess 71 is adapted to receive a bottom portion of a beverage container 80 therein.

The modified console 12A further includes an integral beverage container cooler/heater assembly 70 which includes a modified heat exchanger 72 that has upper and lower legs joined to a bight portion with the lower leg 73 forming the compartment bottom wall 22A, the upwardly extending bight portion forming the front wall 28A, and the upper leg 75 extending forwardly from the bight portion 74. A lower portion of the bight portion 74 contacts a plate 46A of the thermoelectric system 42A so that the thermoelectric system 42A can draw or provide heat to the heat exchanger 72.

The upper portion 78 of the upper leg 75 can be formed with a depression in an upper surface thereof for the beverage container 80 to be seated in to aid in the heat transfer between the beverage container and the heat exchanger 72.

Figure 5A:
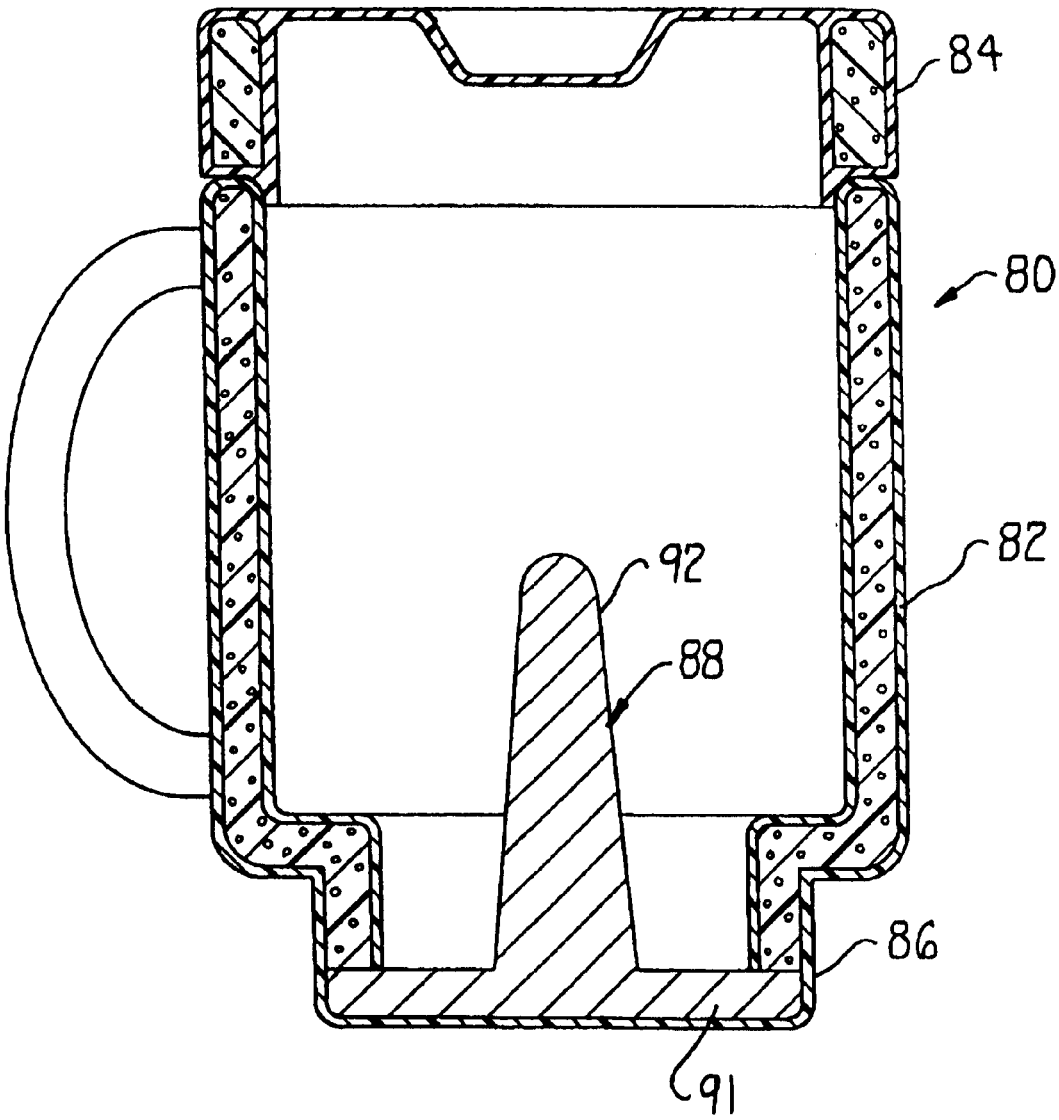
FIG. 5(A) is a cross sectional view of the FIG. 4 beverage container.

The beverage container 80 may also have structure which will assist in transferring the thermal energy to the beverage contained in the container 80 from the heat exchanger 72 and thermoelectric system 42A (FIGS. 5(A) and (B)). The beverage container 80 has an insulated cup portion 82 and a lid 84 which is removably secured to the open top of the cup portion 82 so as to reduce thermal losses or gains through the cup portion open top. The bottom of the cup portion 82 has a reduced diameter bottom portion 86 which is sized to fit within the recess 71. A thermally conductive element 88 is positioned within the cup portion 82 to improve the heat transfer with the heat exchanger upper portion 78 and has a relatively short cylindrical base 91 at the bottom end of the container 80 and a spire 92 integral with and extending upwardly from the base 91 into the beverage containing space defined by the cup portion 82. The spire 92 increases the surface area of the thermally conductive element 88 that is in contact with the beverage to improve the heat exchange with the beverage in the container 80.

Figure 5B:
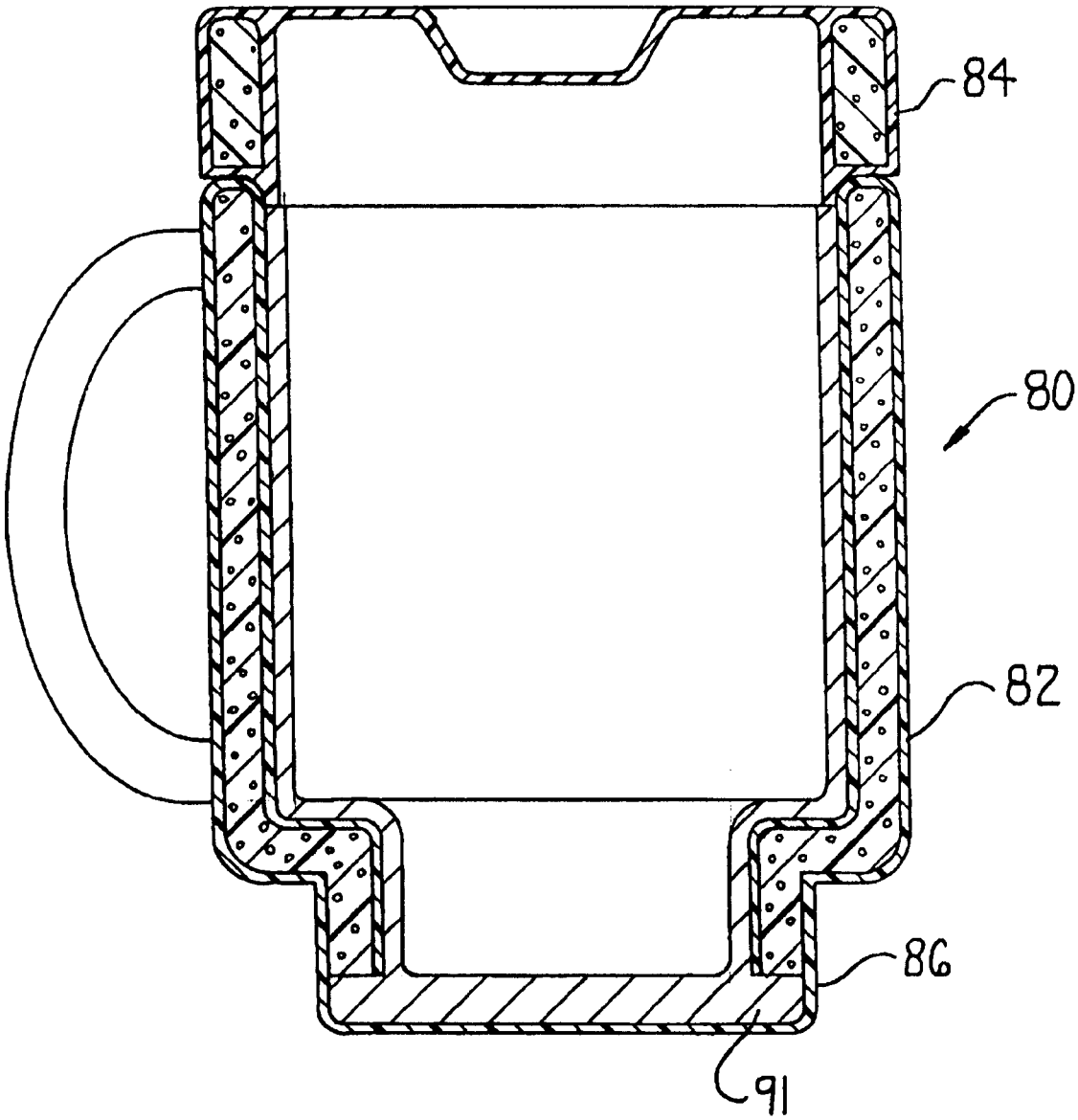
FIG. 5(B) is a cross sectional view of a second embodiment of the beverage container of FIG. 4.

In the embodiment shown in FIG. 5(B), the beverage container 80 does not have a spine 92 but instead has the walls of the container integral with and formed of the same material as the base 91. This enables the heating or cooling of not only a beverage contained therein but also a beverage container such as a can, water bottle, etc.

Figure 6:
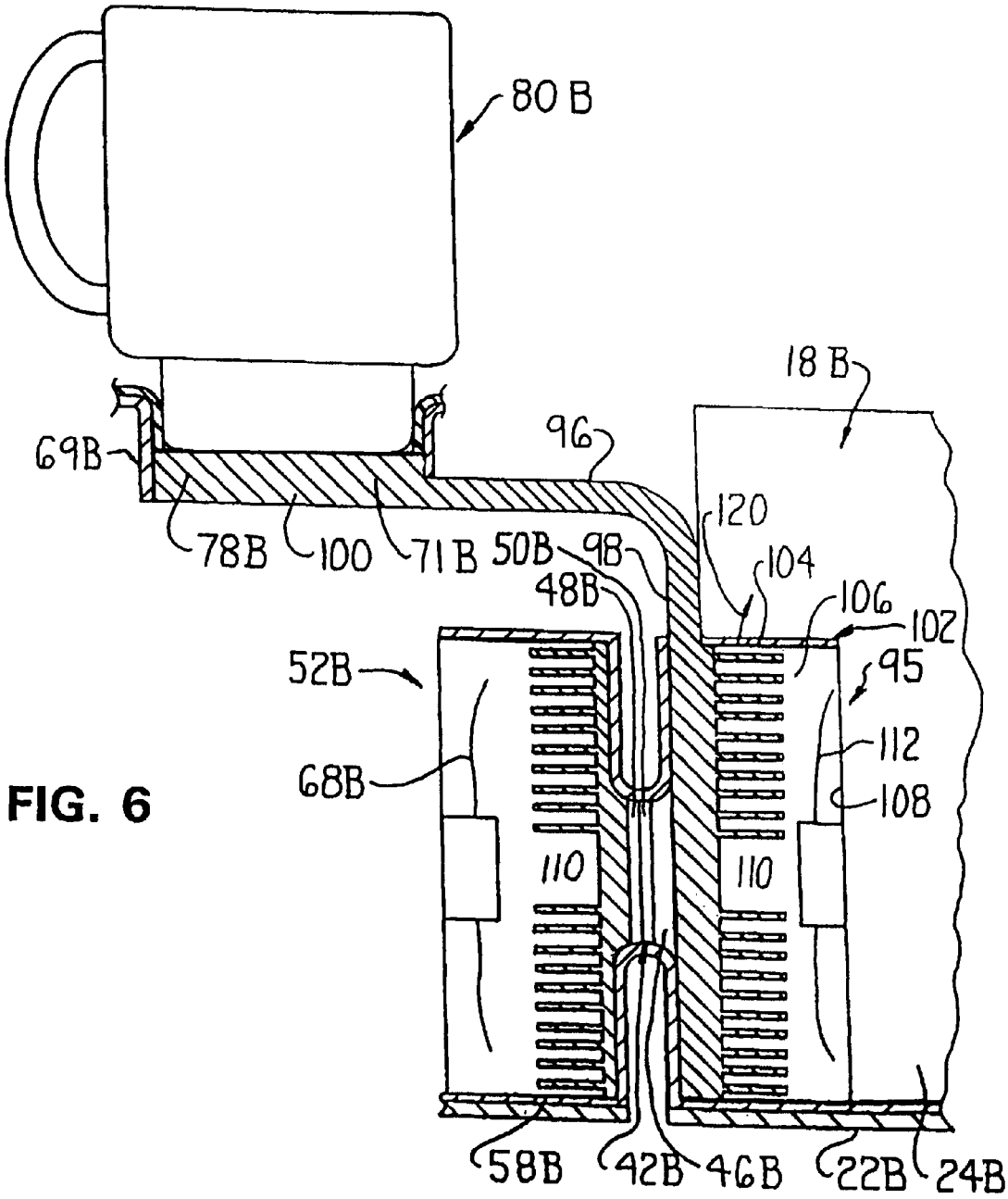
FIG. 6 is a cross sectional view of a modification of the FIG. 4 vehicle console.

Referring to FIG. 6, there is shown a further modification of the present invention, which is a modification of the FIG. 4 embodiment. While the above embodiments use passive air convection and thermal conduction to distribute the thermal energy within the storage compartment, this modification provides a forced convection heat exchanger system 95. The heat exchanger system 95 has an inverted L-shaped heat exchanger 96 which has its vertical leg 98 contacting a plate 46B of the thermoelectric device and a horizontal leg 100 having an upper surface 78B for the beverage container 80B. Thus, the heat exchanger 96 conducts thermal energy to or from the upper surface 78B. An air duct assembly 102 is mounted within the compartment 18B and radiator fins 104 extending from the vertical leg 98 towards the compartment. The air duct assembly 102 has an inflow air duct 108 and outflow air ducts 110 and allows air to flow from the inflow air duct to the outflow air ducts. A fan 112 is mounted in the air duct assembly 102 to draw air into the inflow air duct 108, force air past the radiator fins 104, and out the outflow air ducts 110, i.e., out and into the compartment.

While it is believed that operation of the present invention is apparent based on the above description, the operation of the present invention is outlined below for convenience. If it is desired to cool the compartment 18, then DC electrical power from the power source 44 is sent to the thermoelectric system 42. The direction of current flow causes the thermoelectric system to transfer thermal energy from one heat sink plate 46 and transfer the thermal energy to the other heat sink plate 48. The heat sink plate 46 will transfer thermal energy from thermally conductive element 40 which in turn transfers thermal energy from the heat exchanger 36. The heat exchanger 36 is bound on its outer facing sides by insulated walls 22, 28 and transfers thermal energy from the enclosed compartment 18. Thermal energy builds up at the heat sink plate 48 and is transferred to the extension member 56 and radiator fins 58 of air duct housing 54. The extension member 56 and radiator fins 58 transfers the thermal energy to air passing through the air duct assembly. The fan 68 pulls air in through the inflow air duct 54 and pushes air out of the outflow air duct 66 past the radiating fins 58 and extension member 56. Thusly, heat is transferred from the compartment 18 and is vented out in air from air duct 66. If it is desired to heat the compartment 18, then the DC power supplied to the thermoelectric system is reversed to force heat to flow toward the compartment 18.

The FIG. 4 embodiment cools the compartment 18A in the same manner as explained above with regard to FIG. 2 and can additionally simultaneously cool the beverage container 80 outside of the compartment 18A. The heat exchanger 72 draws thermal energy from the compartment 18A and from the heat exchanger upper portion 78. The heat exchanger upper surface 78 draws thermal energy from the beverage container 80 seated in the recess 71, and if used with the beverage container 80 shown in FIGS. 5(A) and (B), the container mounted heat exchanger 88 will draw thermal energy from within the container 80 and transfer the same to the heat exchanger upper portion 78.

The FIG. 6 embodiment cools the compartment in the same manner as discussed above with regard to the thermoelectric system 42B and the air duct assembly 52B and it provides a forced air convection assembly 95 which forces convection air currents in the compartment 18B to improve the heat exchange therein. The heat exchanger 96 contacts the heat sink plate 46B which draws thermal energy therefrom. A fan 112 pulls air from within the compartment 18B, forces the air past the radiator fins 104 and heat exchanger 96, and pushes the air back into compartment 18B. The heat exchanger 96 draws heat from the air passing thereby to supply this thermal energy to the thermoelectric system 42B.

While the above description only shows a single compartment, it will be within the scope of this invention to have a plurality of compartments whereby at least one of which has features above described. Further, it will be understood that the above described invention is described mounted within a vehicle console, it will work within any type of vehicle, for example automobiles, trucks, trailers, tractors, boats, aircraft, etc., wherein a temperature controlled compartment is desired, and does not have to be mounted within a console.

Although particular preferred embodiments of the invention have been disclosed in detail for illustrative purposes, it will be recognized that variations or modifications of the disclosed apparatus, including the rearrangement of parts, lie within the scope of the present invention.

What is claimed is:

1. A mobile vehicle temperature controlled compartment comprising:

a housing enclosing a compartment for storage of articles therein;

a beverage container receiving recess for receiving a base portion of a beverage container provided at an upper surface of said housing; a heat exchanger forming at least part of a wall of said compartment and being in thermoconductive communication with said beverage container receiving recess; a thermoelectric system comprising first and second heat sinks and a thermoelectric device mounted therebetween for moving thermal energy to and from said compartment, said first heat sink being in thermoconductive communication with said heat exchanger; an electrical power source electrically connected to said thermoelectric system; and an air duct assembly having an extension member in thermoconductive communication with said second heat sink for moving thermal energy from said thermoelectric device and venting same into an air flow so as to cool or heat said compartment.

[2. A mobile vehicle temperature controlled compartment comprising:

a housing enclosing a compartment for storage of articles therein;

a heat exchanger mounted to said compartment;

a thermoelectric system having first and second heat sinks and a thermoelectric device mounted therebetween, said first heat sink being in thermoconductive contact with said heat exchanger;

an electrical power source electrically connected to said thermoelectric system;

and an air duct assembly having an extension member in thermoconductive contact with said second heat sink, an air inflow duct which receives inflow air from an air source and an air outflow duct which segregates and exhausts air separate from said inflow air.]

3. The compartment according to claim 1, wherein said air duct assembly has an air inflow duct which receives inflow air from an air source and an air outflow duct which segregates and exhausts air separate from said inflow air.

4. The compartment according to claim 1, wherein said compartment has an open top, said housing has walls recessed therein defining said compartment and has a pivotable top wall covering said open top, one of said walls having an opening therethrough, said heat exchanger comprises at least a part of at least two walls of the compartment and has a thermally conductive extension element extending through an opening in one of the compartment walls, the extension element contacting said first heat sink.

5. The compartment according to claim 1, wherein said air duct assembly has a third heat sink thermally contacting said second heat sink, said third heat sink conducting thermal energy from said second heat sink and transferring the thermal energy to air flowing through said air duct assembly.

[6. The compartment according to claim 2, wherein said housing has a beverage container receiving recess therein, and said heat exchanger extends into said recess and is in thermoconductive connection to a beverage container seated in said recess.]

7. The compartment according to claim 1, wherein said housing includes a beverage container having a bottom portion adapted to be seated in said recess and a container heat exchanger, said container heat exchanger including a cylindrical base provided at the bottom portion of said container so as to improve the heat flow from the container to the heat exchanger and a spire extending from the base upwardly into the container.

8. The compartment according to claim 1, additionally comprising a fan for forcing convection air currents in the compartment.

9. The compartment according to claim 1, wherein said housing includes a beverage container having a thermoconductive bottom portion adapted to be seated in said recess.

[10. The compartment according to claim 6, wherein said housing includes a beverage container having a thermoconductive bottom portion adapted to be seated in said recess.]

*11. The compartment according to claim 3, wherein an air exit of the air inflow duct is provided opposite to the extension member.*

*12. The compartment according to claim 11, wherein a fan is provided in the air inflow duct.*

*13. The compartment according to claim 11, wherein the air inflow is perpendicular to the extension member and the air outflow is parallel to the extension member.*

*14. A mobile vehicle temperature controlled compartment comprising:*

*a housing enclosing a compartment for storage of articles therein;*

*a heat exchanger mounted to said compartment;*

*a thermoelectric system having first and second heat sinks and a thermoelectric device mounted therebetween, said first heat sink being in thermoconductive contact with said heat exchanger;*

*an electrical power source electrically connected to said thermoelectric system;*

*and an air duct assembly having an extension member in thermoconductive contact with said second heat sink, an air inflow duct which receives inflow air from an air source and an air outflow duct which segregates and exhausts air separate from said inflow air;*

*wherein an air exit of the air inflow duct is provided opposite to the extension member.*

* * * * *

UNITED STATES PATENT AND TRADEMARK OFFICE

CERTIFICATE OF CORRECTION

PATENT NO. : RE 41,295 E
APPLICATION NO. : 11/059703
DATED : May 4, 2010
INVENTOR(S) : Charles J. Cauchy It is certified that error appears in the above-identified patent and that said Letters Patent is hereby corrected as shown below:

On the title page, and col. 1 item [54] change the first word of the title "MOTOR" to --MOBILE--.

Signed and Sealed this

Thirteenth Day of July, 2010

David J. Kappos

David J. Kappos
*Director of the United States Patent and Trademark Office*